United States Patent [19]

DePuy

[11] 4,038,695
[45] July 26, 1977

[54] STATIC TRIP UNIT FOR CIRCUIT PROTECTIVE DEVICES

[75] Inventor: Robert P. DePuy, Cherry Hill, N.J.

[73] Assignee: General Electric Company, New York, N.Y.

[21] Appl. No.: 678,251

[22] Filed: Apr. 19, 1976

[51] Int. Cl.² .......................................... H02H 3/08
[52] U.S. Cl. ..................................... 361/96; 361/42; 361/195
[58] Field of Search ............ 317/13 R, 36 TD, 141 S, 317/18 D

[56] References Cited

U.S. PATENT DOCUMENTS

| 3,040,273 | 6/1962 | Boff | 332/14 |
|---|---|---|---|
| 3,179,850 | 4/1965 | Mathews | 317/36 TD |
| 3,317,795 | 5/1967 | Steen | 317/36 TD |
| 3,328,724 | 6/1967 | Way | 331/113 |
| 3,329,870 | 7/1967 | De Viney | 317/36 TD |
| 3,419,757 | 12/1968 | Steen | 317/36 TD |
| 3,449,695 | 6/1969 | Marsh | 307/261 X |
| 3,654,519 | 4/1972 | South | 317/36 TD |
| 3,831,061 | 8/1974 | Boyd | 317/36 TD |
| 3,942,110 | 3/1976 | Milkovic | 324/142 |
| B 288,627 | 1/1975 | Cuzzo | 235/183 |

OTHER PUBLICATIONS

Electronic Design, 12, (6/7/74).
Electronic Design, 23, (12/8/73).

Primary Examiner—Harry E. Moose, Jr.
Attorney, Agent, or Firm—Robert A. Cahill; Walter C. Bernkopf; Frank L. Neuhauser

[57] ABSTRACT

A static trip unit for automatic electric circuit breakers includes an analog to digital converter for converting an analog signal proportional to the magnitude of current flowing in a distribution circuit to a digital signal having a pulse frequency proportional to the second power of the analog signal. When the analog signal exceeds a preselected threshold level, a binary counter is conditioned to accumulate the digital signal pulse. A decoder monitors the pulse count accumulating in the counter and issues a trip signal when the pulse count reaches a preselected total.

23 Claims, 4 Drawing Figures

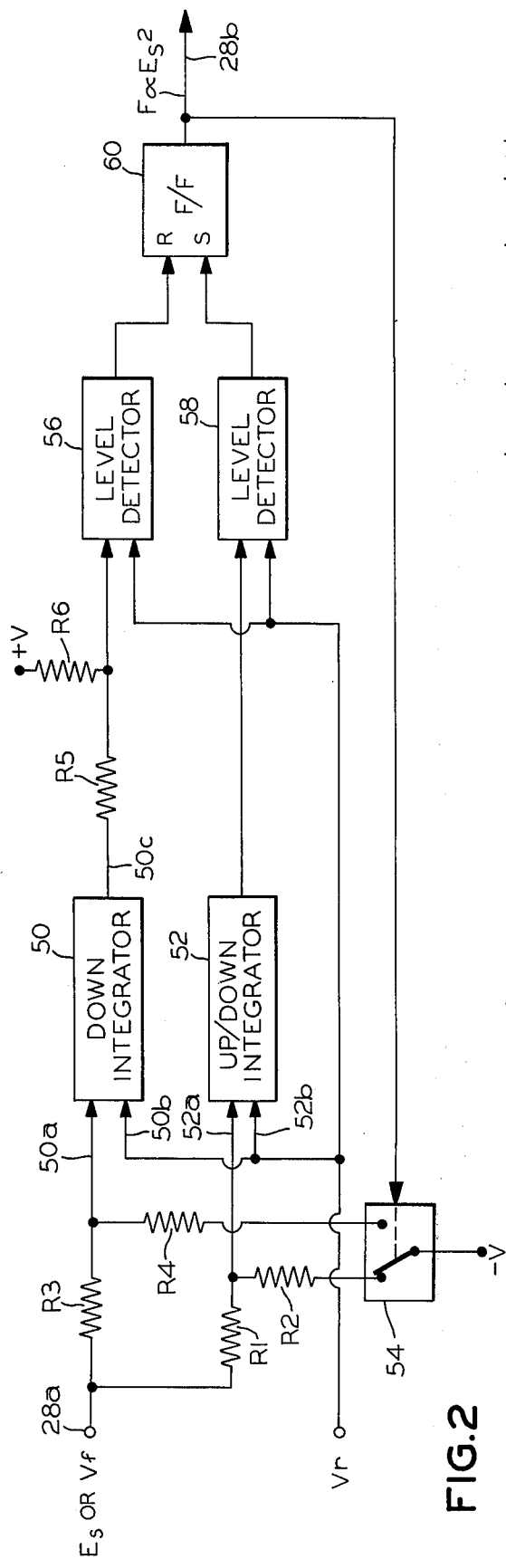
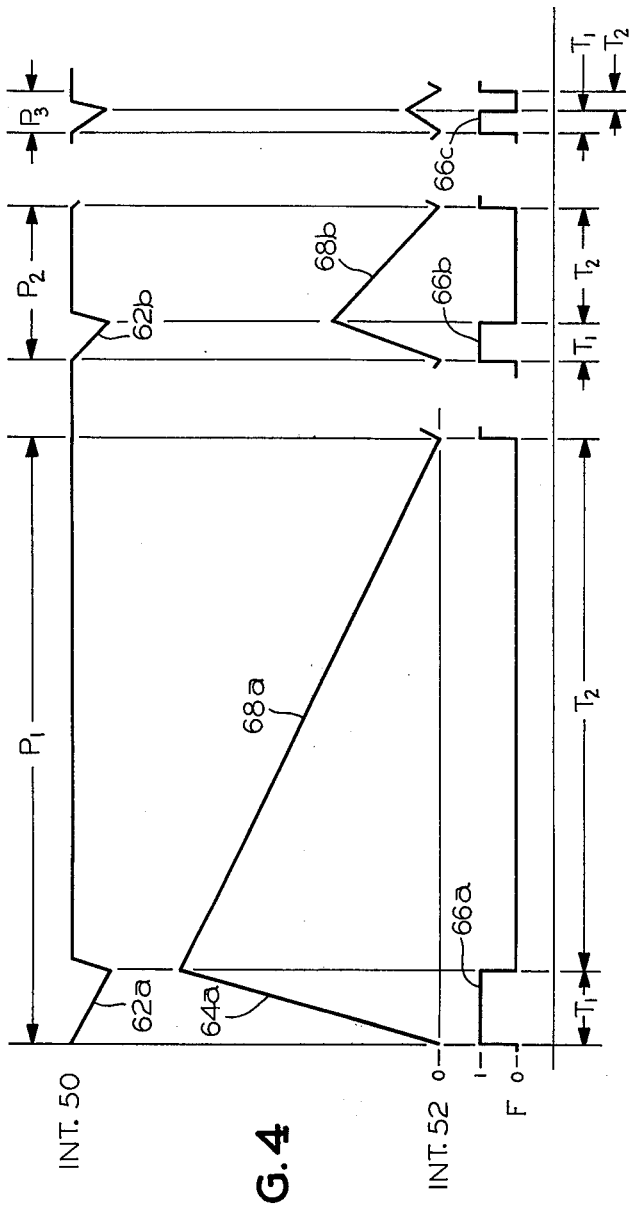
FIG.2
FIG.4

STATIC TRIP UNIT FOR CIRCUIT PROTECTIVE DEVICES

BACKGROUND OF THE INVENTION

Historically, circuit protective devices, such as circuit breakers, have used electromechanical elements responding to an overcurrent condition in a protected circuit pursuant to initiating automatic tripping of the circuit breaker and interruption of the circuit. When the overcurrent condition is of heavy overload or short circuit proportions, it is necessary to trip the circuit breaker virtually instantaneously, and to this end, electromagnetic trip initiating elements have traditionally been utilized. However, for less severe overcurrent conditions, it is desirable to initiate tripping of the circuit breaker after a time delay which is inversely related to the magnitude of the overcurrent. The trip initiating element most widely used to affect such delayed tripping is a bimetal, although electromagnetic tripping mechanisms equipped with suitable mechanical response retardants means, such as dashpots, are commonly used in the larger industrial type circuit breaker. The bimetal is especially suited to this end, since it can be structured such that its mechanical response time is inversely proportional to the second power of the circuit current. This operating characteristic, where the square of the circuit current multiplied by time equals a constant ($I^2t = K$), is ideal since it conforms to the thermal damage characteristic of the protected circuit.

In recent years, the requisite trip-time curve operating characteristic for circuit breakers has been achieved using electronic or "static" trip units. These static trip units utilize combinations of semi-conductor elements and other physically small, low-power solid-state components having no moving parts. The attractiveness of static trip units resides, in part, in low power consumption, environmental stability, and the convenient adjustability of trip settings.

Current static trip unit designs almost invariably utilize an analog circuit approach, wherein energy storage means in the form of a reactive element, such as a capacitor, is implemented to provide the requisite delay which varies inversely as the square of the circuit current. It is a principle object of the present invention to provide a static trip unit which utilizes a predominantly digital circuit approach to the same end. Other objects of the invention will in part be obvious and in part appear hereinafter.

SUMMARY OF THE INVENTION

In accordance with the present invention, there is provided a static trip unit for implementation in circuit protective devices, such as automatic electric circuit breakers. The static trip unit of the present invention includes a translator coupled to the protected circuit and operating to develop an analog signal proportional to the magnitude of the circuit current. This analog signal is supplied to an analog to digital converter operating to develop a digital signal in the form of a pulse train having a pulse frequency proportional to the analog signal raised to the second power. The analog signal from the translator is also supplied to at least one threshold detector which functions to generate an output signal when the analog signal exceeds a preselected threshold level. This detector output signal, which signifies that the circuit current is of overcurrent proportions, enables a binary counter to being accumulating a count of the digital signal pulses issuing from the converter. A decoder, also conditioned by the detector output signal, monitors the content of the binary counter and issues a trip signal when the count therein reaches a preselected total correlated with the detector preselected threshold level. The decoder trip signal, issuing after a time delay which is inversely proportional to the square of the analog signal and thus the square of the circuit current, is utilized to initiate tripping of the circuit breaker.

In accordance with more specific aspects of the present invention, the analog signal at the output of the translator is also applied to a second threshold detector which establishes a preselected threshold level of considerably higher magnitude than the threshold level of the first detector. This second threshold level establishes an instantaneous trip pickup for circuit currents of heavy overload and short circuit proportions. When the analog signal exceeds this second detector threshold level, delayed tripping is not appropriate, and the second detector output signal is utilized directly as a trip initiating signal.

Further in accordance with the present invention, there is provided a third threshold detector for establishing a threshold level at a preselected magnitude falling between the threshold levels of the other two detectors. When the analog signal exceeds this third threshold level, it is appropriate to initiate circuit interruption after a predetermined fixed time delay of relatively short duration. To this end, the analog signal is routed to the analog to digital converter through a selector switch. Also connected to the selector switch for routing to the converter is a fixed analog signal of a magnitude appropriate to produce a digital signal at the output of the converter of a fixed pulse frequency. The selector switch is normally conditioned to route the analog signal from the translator through to the converter. However, when the analog signal exceeds the third detector threshold level, the output signal from this detector conditions the selector switch to route the fixed analog signal to the converter. The third detector output signal also conditions the binary counter to begin counting the digital pulses appearing at the output of the converter and to condition the decoder to establish a second count total correlated with the fixed analog signal so as to provide the desired fixed short time delay. When the second count total is reached in the binary counter, the decoder issues its trip signal.

The present invention is further ideally suited to handle a ground fault tripping function. To this end, the static trip unit is further provided with a ground fault signal translator functioning to provide a ground fault analog signal proportional to the magnitude of ground fault current existing in the circuit. This analog signal is supplied to a fourth threshold detector which, when its preselected threshold level is exceeded, issues an output signal to condition the selector switch to route the fixed analog signal to the input of the converter; this output signal further conditioning the binary counter to begin counting the digital signals issuing at the output of the converter and conditioning the decoder to establish a preselected count total. When the count in the binary counter exceeds this count total, the decoder issues its trip signal to precipitate circuit interruption.

The invention accordingly comprises the features of construction, combination and elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawings, in which:

FIG. 2 is a detailed circuit schematic, partially in block form, of the analog to digital converter of FIG. 1;

FIG. 3 is a schematic diagram, partially in block form, of the down integrator of FIG. 2;

FIG. 4 is a signal timing diagram illustrating the operation of the analog to digital converter of FIG. 2.

DETAILED DESCRIPTION

Figure 1:
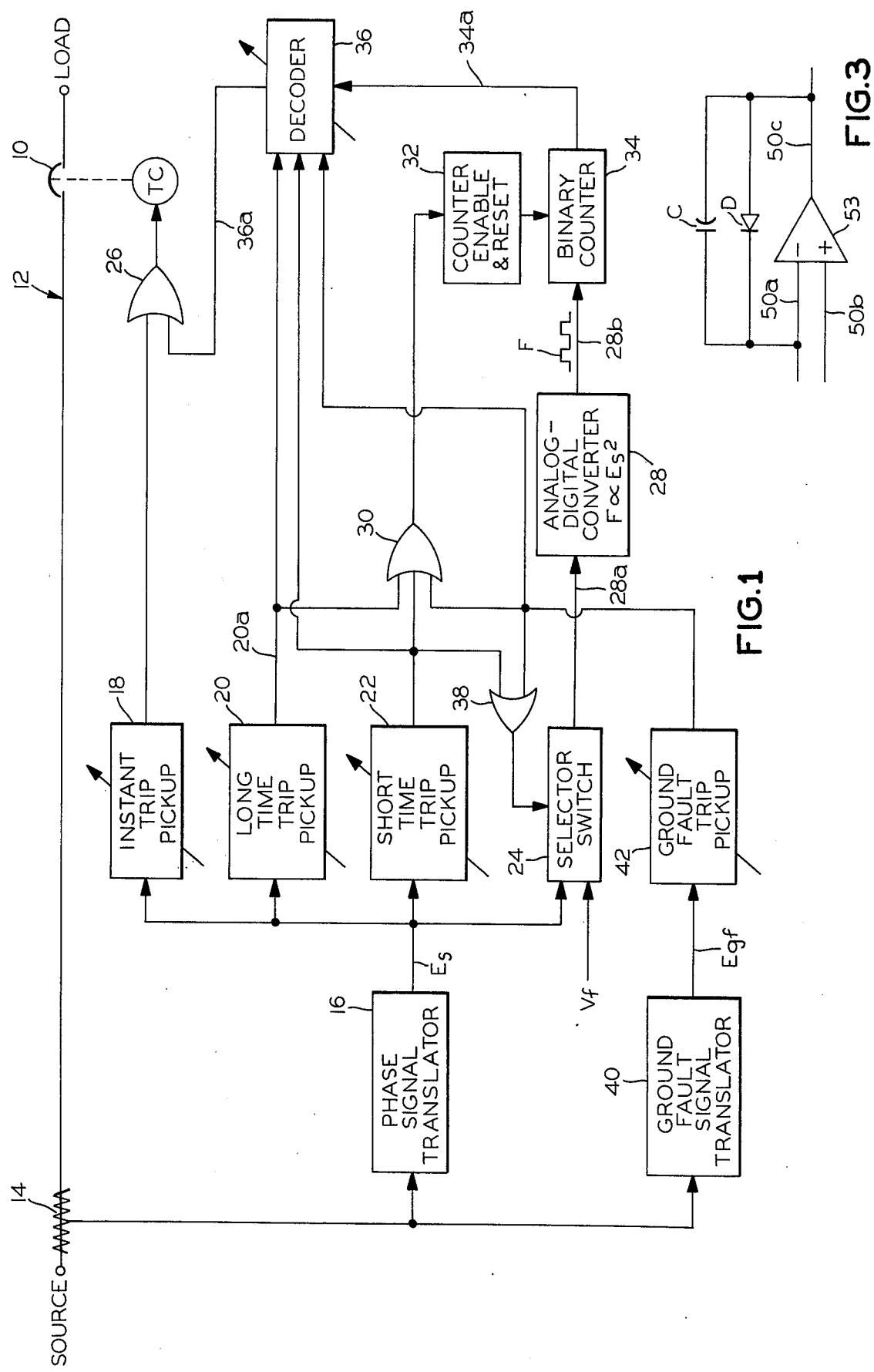
FIG. 1 is a logic block diagram of a static trip unit constructed according to an embodiment of the present invention.

The static trip unit of the present invention is illustrated in FIG. 1 as being implemented in a circuit breaker having contacts 10 for interrupting the current flowing in a power distribution circuit, generally indicated at 12. It will be appreciated that, while only one phase conductor is illustrated in FIG. 1, the distribution circuit 12 will typically be a polyphase circuit having plural phase conductors. Thus, the circuit breaker will have similar contacts 10 in each phase of the circuit; the breaker contacts being ganged together such that interruption of the current flowing in all phases of the circuit is achieved simultaneously. Current sensing means 14, traditionally in the form of separate current transformers inductively coupled with each phase of the circuit 12, supply separate signals indicative of the current magnitudes flowing in their respective phases to a phase signal translator 16. This translator may be constructed in a known manner to include auxiliary transformers, bridge rectifying networks and appropriate buffering, such as disclosed in the commonly assigned Hobson et al U.S. Pat. No. 3,786,311, for the purpose of generating at its output an analog signal voltage Es of a magnitude proportional to the highest peak current flowing in any one phase of the distribution circuit 12.

The translator analog signal voltage output Es is supplied in common to an instantaneous trip pickup circuit 18, a long time trip pickup circuit 20, a short time trip pickup circuit 22 and a selector switch 24. These pickup circuits function as comparators or threshold detectors designed to issue output signals when the analog signal voltage Es exceeds a preselected threshold level adjustably established in each detector. That is, the instantaneous trip pickup circuit may be adjusted such that its output will issue when the analog signal voltage magnitude exceeds a preselected threshold level corresponding to a current flow in any phase of the distribution circuit 12 exceeding, for example, 20 times rated current. It will be appreciated that adjustment of the instantaneous trip threshold level may be made available to the user such that an output signal will issue for a range of X factors, for example, phase currents of 15 to 25 times rated current. When the threshold level established in instantaneous trip pickup circuit 18 is exceeded by the analog voltage signal Es, the resulting output signal is supplied as one input to an OR gate 26 which, in turn, generates a trip initiating signal to the circuit breaker trip coil TC, as functionally indicated in FIG. 1. It will be understood that, in practice, the trip initiating signal issuing from OR gate 26 conditions an electronic switch to complete an energization circuit for the trip coil TC which then acts electromechanically to initiate tripping of circuit breaker to open its contacts 10. It is seen that tripping of the circuit breaker via the instantaneous trip pickup circuit is achieved without any intentional delay, which is appropriate since the extreme overcurrent condition in the distribution circuit mandates immediate circuit interruption to avoid damage to the distribution circuit and any loads connected thereto.

Still referring to FIG. 1, the long time trip pickup circuit 20 measures the analog signal voltage Es with respect to a threshold adjustably selected to correspond to an overcurrent condition which is not so severe as to require immediate circuit interruption. That is, for the situation where the phase current is in excess of rated current and up to 6 times rates current, for example, it is desired to delay tripping of the circuit breaker for a time interval which is inversely proportional to the phase current raised to the second power. To this end, the analog signal voltage Es is routed through a selector switch 24 to the input terminal 28a of an analog to digital converter 28. This converter, to be described in greater detail in connection with FIG. 2, is structured to generate at its output 28b a digital signal F in the form of a pulse train having a pulse frequency which is proportional to the analog signal voltage Es raised to the second power. When the long time trip pickup circuit 20 detects that the analog signal voltage has exceeded its preselected threshold level, which may correspond to a phase current equal to rated current, an output signal issues on its output lead 20a. This output signal is routed through an OR gate 30 to a counter enable and reset circuit 32. This circuit, which actually may be an integral part of a binary counter 34, functions to enable the counter to count the digital signal pulses F at its input as long as the output signal from long time trip pickup circuit 20 is present and to reset the binary counter to zero upon each termination of this pickup circuit output signal. It is thus seen that the binary counter begins counting from zero the digital signal pulses on converter output lead 28b the instant the analog signal voltage Es exceeds the threshold level established by the long time trip pickup circuit and continues to accumulate these digital signal pulses as long as the analog signal voltage continues to exceed this threshold level. If the overcurrent condition is only temporary, the analog signal voltage will fall below this threshold level and the output signal from pickup circuit 20 terminates. With this signal termination, binary counter 34 is disabled and zeroed by circuit 32.

Assuming the analog signal voltage Es continues to exceed the threshold level established by long time trip pickup circuit 20, its output signal, in addition to holding the binary counter 34 enabled for continuing pulse accumulation, is supplied to condition a decoder 36, thereby establishing therein a preselected pulse total. The decoder continuously monitors the content of the binary counter supplied to it over connections 34a, and, when the accumulated pulse count therein exceeds the total conditioned by the output signal from pickup circuit 20, generates a trip initiating signal applied over its output 36a to the other input of OR gate 26. The resulting output from this gate then precipitates circuit interruption.

As seen in FIG. 1, the analog voltage signal is also supplied to the short time trip pickup circuit 22 having a preselected threshold level corresponding to an overcurrent condition which is of a magnitude in excess of the overcurrent conditions handled by pickup circuit 20 but less than the extreme overload and short circuit conditions handled by pickup circuit 18. Thus, for example, the threshold level for pickup circuit 22 may be established for a phase overcurrent in excess of six times rated current. Under these circumstances, it is customary to initiate tripping of the circuit breaker if an overcurrent condition of this magnitude persists for a preselected, short time interval of fixed duration. To this end, the output signal issuing from the short time trip pickup circuit 22 while the analog signal voltage $Es$ is in excess of its threshold level is supplied through an OR gate 38 to condition selector switch 24 such that a fixed analog signal voltage $Vf$ is routed to the input 28a of converter 28 in lieu of the analog signal voltage $Es$. As a consequence, the digital signal F issuing at the output of converter 28 is of a fixed pulse frequency proportional to the square of the fixed analog signal voltage $Vf$. At the same time, the output from pickup circuit 22 supplied through OR gate 30 to counter enable and reset circuit 32 which enables the binary counter to begin counting the digital signal pulses at its input. Also the output signal from pickup circuit 22 is supplied to decoder 36 to set up a preselected pulse total therein which is correlated with the preselected threshold level in the short time trip pickup circuit. When the count accumulating in binary counter 34 exceeds this preset pulse total, the decoder 36 issues its trip initiating signal to OR gate 26.

It will be noted that if the analog signal voltage exceeds the threshold level established by the short time trip pickup circuit 22, it will also exceed the threshold level established by the long time trip pickup circuit 20. Consequently, counter enabling signals appear at the outputs of both of these pickup circuits. If the analog signal voltage falls below the threshold level established by the short time trip pickup circuit before the short time delay expires, the consequent termination of the output signal from this pickup circuit will cause the selector switch 24 to revert to its normal condition wherein the analog signal voltage $Es$ is routed to the input of converter 28. However, since the counter remains enabled by the output signal from the long time trip pickup circuit and is not zeroed by the termination of the output signal from the short time trip pickup circuit, pulse counting continues but at a rate proportional to the square of the analog signal voltage $Es$ rather than the fixed analog signal voltage $Vf$. At the same time, the removal of the short time trip pickup circuit output signal from decoder 36 disables the count total previously established thereby, and the decoder than proceeds to monitor the content of counter 34 on the basis of the count total established by the output signal from the long time trip pickup circuit 20.

As an additional feature of the present invention, the static trip unit illustrated in FIG. 1 can be equipped to also provide ground fault protection. To this end, sensing means 14 will further include means such as a differential current transformer for developing a signal proportional to the magnitude of circuit current flowing through a ground fault thereon. This ground fault signal is supplied to a ground fault signal translator 40 functioning to generate at its output a DC analog signal voltage $Egf$ also proportional to the magnitude of ground fault current. If the ground fault analog signal voltage exceeds a preselected threshold level established by a ground fault trip pickup circuit 42, the output signal resulting therefrom is applied (1) through OR gate 38 to condition selector switch 24 to route the fixed analog signal voltage $Vf$ to the input 28b of converter 28 in lieu of the analog signal voltage $Es$, (2) through OR gate 30 to enable, via circuit 32, the binary counter to begin counting the digital signal pulses issuing from the converter, and (3) to effectuate a pulse total in decoder 36 which, when reached in counter 34, produces the trip initiating signal on decoder output lead 36a. It will be appreciated that the short time and ground fault delays, rather than being fixed, can also be made to vary inversely with time utilizing converter 28.

Turning to FIG. 2, the analog to digital converter 28 will now be described in greater detail. The phase current analog signal voltage $Es$ or the fixed analog signal voltage $Vf$, depending upon the condition of selector switch 24 (FIG. 1), is applied to converter input terminal 28a, which is connected through a resistor R3 to input 50a of a down integrator 50 and through resistor R1 to input 52a of an up/down integrator 52. A suitable reference voltage $Vr$, such as ground potential, is applied to the other inputs 50b and 52b of integrators 50 and 52, respectively. Integrators 50 and 52 are preferably of the operational amplifier type as illustrated in FIG. 3, wherein in inverting input to an operational amplifier 53 corresponds to the down integrator input 50a in FIG. 2. The reference voltage is applied to the non-inverting input of 50b of this operational amplifier. The output 50c of the operational amplifier is connected to its inverting input 50a via an integrating capacitor C. The only difference in the construction of the down integrator 50 from the up/down integrator 52 is that in the former, the integrating capacitor C is shunted by a diode D, as shown in FIG. 3. Consequently, down integrator 50 is capable of being set to a predetermined point, which is the forward voltage drop of diode D, by integrating in the up or positive direction. Integration of integrator 50 in the up or positive direction is limited by diode D shunting the integrator capacitor C, when the voltage of capacitor reaches the forward voltage drop of diode D. Since diode D is omitted from up/down integrator 52, integration in both the positive and negative directions is accommodated without a built in diode limit.

Returning to FIG. 2, the junction between resistor R3 and down integrator input 50a is connected through resistor R4 to one contact of a transfer switch 54. The junction between resistor R1 and input 52a of up/down integrator 52 is connected through a resistor R2 to another contact of transfer switch 54. As will be seen, the transfer switch is conditioned to connect either the lower end of resistor R2 or the lower end of resistor R4 to a fixed negative potential $-V$.

The output of down integrator 50 appearing on output lead 50c is supplied through resistor R5 to one input of a comparator circuit 56 functioning as a level detector. The junction between R5 and the one input of the level detector is referenced to a positive supply voltage $-V$ through a resistor R6. The output of up/down integrator 52 is supplied directly to one input of a level detector 58. The reference voltage $Vr$ is supplied as the second input to each of the level detectors 56 and 58. The output of level detector 56 is supplied to the reset input of a flip flop 60, while the output of level detector 58 is applied to the set input of this flip flop. As will be seen, the digital signal pulse train F at the output 28b of the converter 28 (FIG. 1) is taken from the output of flip flop 60 for application to binary counter 34. This digital pulse train is also fed back to control the condition of selector switch 54. Specifically, when flip flop 60 is in its set condition, selector switch 54 is conditioned to connect resistor R2 to the negative supply voltage −V, and the selector switch is conditioned to connect resistor R4 to the negative supply voltage −V when the flip flop is reset.

The operation of the analog digital converter of FIG. 2 will now be described in conjunction with the signal timing diagram of FIG. 4. To begin a digital signal pulse cycle, flip flop 60 is in its set condition, and the transfer switch is thus in its position shown in FIG. 2 with resistor R2 connected to the negative supply voltage V and the lower end of resistor R4 left hanging. The current appearing at the input 50a of integrator 50, which is equal to the analog signal voltage Es (neglecting Vf for this description) divided by the resistance R3, begins charging the integrating capacitor C (FIG. 3), and the voltage at the output of this integrator, indicated at 62a in FIG. 4, falls negatively with a slope proportional to Es/R3. At the same time, the integrating capacitor in integrator 52, which is not shunted by a diode, discharges at a rate proportionate to $Es/R1 + (-V)/R2$, and the voltage at the output of this integrator, indicated at 64a in FIG. 4, rises positively with a slope proportional to $V/R2 - Es/R1$. This condition will continue until the integrator 50 output voltage at 50c causes the output of level detector 56 to change state and reset flip flop 60. This is accomplished when the voltage at the integrator output 50c pulls the voltage at the junction of resistors R5 and R6 through zero to a negative potential. It is seen from FIG. 4 that this resetting of the flip flop concludes the interval T1 of a digital signal pulse, indicated at 66a. Also, the flip flop and switch 54 function as steering logic to alter the integrator input circuit configuration by connecting resistor R4 to the negative potential V and leaving resistor R2 hanging. Under these circumstances, the integrating capacitor in integrator 50 abruptly discharges until the diode becomes forward biased (FIG. 3), at which time the integrator output 50c is essentially ground potential (FIG. 4), neglecting the diode forward voltage drop. However in the case of integrator 52, its integrating capacitor is charged by the current Es/R1 at its input 52a. The voltage at the output of this integrator, which reached a positive peak voltage (proportional to $V/R2 31 Es/R1$) at the conclusion of time T1, swings into a negative slope, indicated at 68a, which is proportional to Es/R1. When the integrator output voltage falls through zero to a negative potential, level detector 58 issues an output effective to set flip flop 60 and thus conclude a digital signal pulse cycle with an interpulse time interval designated by T2 in FIG. 4. The setting of the flip flop reconditions switch 54 to begin the next pulse cycle.

It can be demonstrated mathematically that the digital signal pulse period (T1 +T2) is inversely proportional to $Es^2$, which is the equivalent of the pulse frequency being directly proportional to $Es^2$, and thus the converter 28 achieves the desired trip time delay which varies inversely as the square of the circuit current. This relationship can be seen graphically from FIG. 4, wherein signal timing diagrams for three levels of analog signal voltages are shown. It is assumed that the analog signal voltage Es for the illustrated digital signal pulse cycle P2 is twice the analog signal voltage for pulse cycle P1, and the analog signal voltage for the pulse cycle P3 is four times the analog signal voltage for pulse cycle P1. Comparing pulse cycles P1 and P2, it is seen that, for the respective pulse interval times T1, the voltage at the output of integrator 50 reaches its negative peak in half the time for pulse cycle P2, since its slope 62b is determined by Es/R3. Thus, the width of pulse 66b is one-half the width of pulse 66a. Since the slope of the voltage rise at the output of integrator 52 and thus also its peak voltage attained at the conclusion of T1 are inversely related to the analog signal voltage (V/R2 − Es/R1), the positive peak voltage achieved at the output of integrator 52 for the pulse period P2 is much less than that achieved for pulse period P1. It is seen that this factor coupled with the fact that the integrator 52 output voltage in its negative-going excursion 68b from its positive peak has a slope directly proportional to Es/R1 operate to significantly shorten the interpulse time T2 for pulse period P2 as compared to pulse period P1. The result is that by adding the respective T1 and T2 times for the pulse periods P1 and P2, the latter pulse period is one-fourth the duration of the former. Corresponding comparisons in FIG. 4 illustrate that the pulse period P3 is one-fourth the length of pulse period P2 and one-sixteenth the length of pulse period P1. It is seen conversely that the pulse frequency corresponding to pulse period P3 is four times the pulse frequency corresponding to pulse period P2 and 16 times the pulse frequency corresponding to pulse period P1.

It will thus be seen that the objects set forth above, among those made apparent in the preceding description, are efficiently attained and, since certain changes may be made in the above construction without departing from the scope of the invention, it is intended that all matter contained in the above description or shown in the accompanying drawings shall be interpreted as illustrative and not in a limiting sense.

Having described my invention, what I claim as new and desire to secure by Letters Patent is:

1. A static trip unit for application in an electric circuit breaker to initiate its interruption of a protected electrical distribution circuit automatically in response to an abnormal circuit condition, said trip unit comprising, in combination:
    A. a signal translator coupled to the distribution circuit for developing an analog signal proportional to the magnitude of current flowing in the circuit;
    B. an analog to digital converter electrically connected to said signal translator for generating a digital signal having a pulse frequency proportional to the square of said analog signal;
    C. a binary counter connected to said converter and operable to accumulate a count of said digital signal pulses;
    D. a threshold detector having an input connected to receive said analog and operating to develop an output signal when said analog signal exceeds a preselected level, said output signal applied to condition said counter to accumulate said digital signal pulses; and
    E. a decoder connected to monitor the pulse count accumulating in said counter and operating to generate a trip initiating signal when said pulse count reaches a preselected total.

2. The static trip unit defined in claim 1, wherein said detector output signal persists as long as said analog signal exceeds said threshold level, said trip unit further including means responsive to said detector output signal for enabling said counter to count said digital signal pulses as long as said detector output signal persists and resetting said counter to zero each time said detector output signal disappears.

3. The static trip unit defined in claim 2, which further includes plural threshold detectors each having an input connected to receive said analog signal, each said threshold detector operating independently to develop a separate output signal when said analog signal exceeds its preselected threshold level, said counter enabling and resetting means enabling said counter as long as said output signal from any one of said detectors persists.

4. The static trip unit defined in claim 3, which further includes means separately feeding said output signals from said plural detectors to said decoder to effectuate different preselected total respectively correlated with said different threshold levels of said detectors, whereby said decoder generates said trip initiating signal when the pulse count in said counter exceeds the preselected total effectuated by the output signal persisting at that time.

5. The static trip unit defined in claim 4, which further includes switching means conditioned to normally couple said analog signal to said analog to digital converter, the output signal from one of said detectors connected to conditioned said switching means to disconnect said analog signal from the input of said converter and to instead apply to said converter input a fixed analog signal, whereby, as long as said analog signal exceeds the threshold level of said one detector, the pulse frequency of said digital signal is determined by said fixed analog signal.

6. The static trip unit defined in claim 4, which further includes an additional threshold detector connected to receive said analog signal, said additional detector operating to generate an instantaneous trip initiating signal when said analog signal exceeds a preselected, high magnitude threshold level.

7. The static trip unit defined in claim 1, wherein said analog to digital converter includes
   1. first and second integrators operating in concert to perform integrations of said analog signal, and
   2. steering logic responsive to the signal outputs of said integrators for controlling the integrating functions thereof and having an output on which said digital signal pulses are developed.

8. The static trip unit defined in claim 7, wherein said steering logic includes a bistable circuit cycled between first and second stable states under the control of said integrator signal outputs and a transfer switch controlled by said bistable circuit to cyclically alter the manner of application of said analog signal to said integrators.

9. The static trip unit defined in claim 8, wherein said analog to digital converter further includes
   1. a first level detector monitoring the signal output of said first integrator and operating to trigger said bistable circuit to its first state when said first integrator signal output exceeds a predetermined reference level, and
   2. a second level detector monitoring the signal output of said second integrator and operating to trigger said bistable circuit its second signal state when said second integrator output exceeds a pre-established reference level.

10. The static trip unit defined in claim 9, wherein said transfer switch has first and second switch positions assumed under the control of said bistable circuit, said transfer switch, while in its first position, conditioning said first integrator to vary its signal output in response to said analog signal from a quiescent level at a rate proportional to the analog signal magnitude and conditioning said second integrator to vary its signal output in a first direction at a rate inversely related to the magnitude of said analog signal; upon operation of said first level detector in triggering said bistable circuit from its second state to its first state, said switch is transferred to its second switch position to condition said first integrator to rapidly return its signal output to said quiesecent level and to condition said second integrator to change its signal output in the opposite direction at a rate proportional to the analog signal amplitude, when said integrator signal output passes through said reference level of said second level detector, said bistable circuit is triggered by said second level detector back to its first stable state concluding a pulse cycle of said digital signal.

11. The static trip unit defined in claim 10, wherein said detector output signal persists as long as said analog signal exceeds said threshold level, said trip unit further including means responsive to said detector output signal for enabling said counter to count said digital signal pulses as long as said detector output signal persists and resetting said counter to zero each time said detector output signal disappears.

12. The static trip unit defined in claim 11, which further includes plural threshold detectors each having an input connected to receive said analog signal, each said threshold detector operating independently to develop a separate output signal when said analog signal exceeds its preselected threshold level, said counter enabling and resetting means enabling said counter as long as said output signal from any one of said detectors persists.

13. The static trip unit defined in claim 12, which further includes means separately feeding said output signals from said plural detectors to said decoder to effectuate different preselected total respectively correlated with said different threshold levels of said detectors, whereby said decoder generates said trip initiating signal when the pulse count is said counter exceeds the preselected total effectuated by the output signal persisting at that time.

14. A static trip unit defined in claim 13, which further includes an additional threshold detector connected to receive said analog signal, said additional detector operating to generate an instantaneous trip initiating signal when said analog signal exceeds a preselected, high magnitude threshold level.

15. A static trip unit for application in an electric circuit breaker to initiate its interruption of a protected electrical distribution circuit automatically in response to an abnormal circuit condition; said trip unit comprising, in combination:
   A. an overcurrent signal translator coupled to the distribution circuit for developing an analog signal proportional to the current flowing in the circuit;
   B. an instantaneous trip pickup circuit electrically connected to receive said analog signal from said translator and operating to generate a first trip initiating signal when said analog signal exceeds a first preselected threshold level;
   C. a long time trip pickup circuit electrically connected to receive said analog signal from said translator and operating to generate a first output signal when said analog signal exceeds a second preselected threshold level;
   D. an analog to digital converter electrically connected to receive said analog signal from said translator and operating to generate a digital signal having a pulse frequency proportional to said analog signal raised to the Nth power, where N is greater than one;

E. a binary counter connected to said converter and operating to accumulate a count of said digital signal pulses;

F. means connected to receive said first output signal for enabling said counter to accumulate said digital signal pulses as long as said first output signal persists and zeroing said counter upon each termination of said first output signal; and G. a decoder connected to receive said first output signal, said first output signal establishing a first preselected pulse count total in said decoder, said decoder further connected to said counter and operating to monitor the pulse count accumulating therein, said decoder generating a second trip initiating signal when said pulse count in said counter reaches said first preselected pulse total.

16. The static trip unit defined in claim 15, which further includes:

A. a ground fault signal translator coupled to the distribution circuit for developing a ground fault analog signal proportional to the magnitude of current flowing through a ground fault thereon;

B. a routing switch having a first position routing said analog signal from said overcurrent signal translator to said converter and a second position routing a reference analog signal to the input of said converter; and C. a ground fault trip pickup circuit operating to generate a second output signal when said ground fault analog signal exceeds a third preselected threshold level, said second output signal
 1. connected to said routing switch for converting said switch from its normal first position to its second position,
 2. connected to said counter enabling and zeroing means, and
 3. connected to said decoder for establishing a second preselected pulse count total.

17. The static trip unit defined in claim 16, which further includes a short time trip pickup circuit electrically connected to said overcurrent signal translator and receiving said analog signal therefrom, said short time trip pickup circuit operating to generate a third output signal when said analog signal exceeds a fourth threshold level, said third output signal,
 1. connected to said routing switch for converting said switch to its second position,
 2. connected to said counter enabling and zeroing means, and
 3. connected to said decoder for establishing a third preselected pulse count total.

18. The static trip unit defined in claim 15, wherein said analog to digital converter includes
 1. first and second integrators operating in convert to perform integrations of said analog signal, and
 2. steering logic responsive to the signal outputs of said integrators for controlling the integrating functions thereof and having an output on which said digital signal pulses are developed.

19. The static trip unit defined in claim 18, wherein said steering logic includes a bistable circuit cycled between first and second stable states under the control of said integrator signal outputs and a transfer switch controlled by said bistable circuit to cyclically alter the manner of application of said analog signal to said integrators.

20. The static trip unit defined in claim 19, wherein said analog to digital converter further includes
 1. a first level detector monitoring the signal output of said first integrator and operating to trigger said bistable circuit to its first state when said first integrator signal output exceeds a predetermined reference level, and
 2. a second level detector monitoring the signal output of said second integrator and operating to trigger said bistable circuit its second signal state when said second integrator output exceeds a pre-established reference level.

21. The static trip unit defined in claim 20, wherein said transfer switch has first and second switch positions assumed under the control of said bistable circuit, said transfer switch, while in its first position, conditioning said first integrator to vary its signal output in response to said analog signal from a quiescent level at a rate proportional to the analog signal magnitude and conditioning said second integrator to vary its signal output in a first direction at a rate inversely related to the magnitude of said analog signal; upon operation of said first level detector in triggering said bistable circuit from its second state to its first state, said switch is transferred to its second switch position to condition said first integrator to rapidly return its signal output to said quiescent level and to condition said second integrator to change its signal output in the opposite direction at a rate proportional to the analog signal amplitude, when said integrator signal output passes through said reference level of said second level detector, said bistable circuit is triggered by said second level detector back to its first stable state concluding a pulse cycle of said digital signal.

22. The static trip unit defined in claim 21, which further includes:

A. a ground fault signal translator coupled to the distribution circuit for developing a ground fault analog signal proportional to the magnitude of current flowing through a ground fault thereon;

B. a routing switch having a first position routing said analog signal from said overcurrent signal translator to said converter and a second position routing a reference analog signal to the input of said converter; and C. a ground fault trip pickup circuit operating to generate a second output signal when said ground fault analog signal exceeds a third preselected threshold level, said second output signal
 1. connected to said routing switch for converting said switch from its normal first position to its second position,
 2. connected to said counter enabling and zeroing means, and
 3. connected to said decoder for establishing a second preselected pulse count total.

23. The static trip unit defined in claim 22, which further includes a short time trip pickup circuit electrically connected to said overcurrent signal translator and receiving said analog signal therefrom, said short time trip pickup circuit operating to generate a third output signal when said analog signal exceeds a fourth threshold level, said third output signal,
 1. connected to said routing switch for converting said switch to its second position,
 2. connected to said counter enabling and zeroing means, and
 3. connected to said decoder for establishing a third preselected pulse count total.

* * * * *

UNITED STATES PATENT OFFICE
CERTIFICATE OF CORRECTION

PATENT NO. : 4,038,695
DATED : July 26, 1977
INVENTOR(S) : Robert P. DePuy

It is certified that error appears in the above-identified patent and that said Letters Patent are hereby corrected as shown below:

Column 8, line 51, after the word "analog", insert the word --signal--

Column 10, line 7, change "quiesecent" to --quiescent--

Column 10, line 39, change "is" to --in--

Column 11, line 57, change "convert" to --concert--

Signed and Sealed this

Eighth Day of November 1977

[SEAL]

Attest:

RUTH C. MASON
Attesting Officer

LUTRELLE F. PARKER
Acting Commissioner of Patents and Trademarks